United States Patent [19]

Stessen

[11] Patent Number: 5,138,278
[45] Date of Patent: Aug. 11, 1992

[54] BROADBAND SIGNAL AMPLIFIER

[75] Inventor: Jeroen H. Stessen, Eindhoven, Netherlands

[73] Assignee: U.S. Philips Corporation, New York, N.Y.

[21] Appl. No.: 663,488

[22] Filed: Mar. 1, 1991

[30] Foreign Application Priority Data

Mar. 7, 1990 [NL] Netherlands ..................... 9000518

[51] Int. Cl.$^5$ .............................................. H03F 1/34
[52] U.S. Cl. ................................... 330/294; 330/301; 330/311
[58] Field of Search ............... 330/107, 109, 275, 294, 330/250, 301, 311; 358/184

[56] References Cited

U.S. PATENT DOCUMENTS

| | | | |
|---|---|---|---|
| 2,983,876 | 5/1961 | Tongue | 330/294 X |
| 3,025,472 | 3/1962 | Greatbatch | 330/294 X |
| 4,184,176 | 1/1980 | Sahara et al. | 358/184 |
| 4,335,359 | 6/1982 | Kriedt et al. | 330/294 X |

FOREIGN PATENT DOCUMENTS

| | | |
|---|---|---|
| 0263601 | 4/1988 | European Pat. Off. . |
| 0353742 | 2/1990 | European Pat. Off. . |
| 1499192 | 10/1967 | France . |
| 2269236 | 11/1975 | France . |

OTHER PUBLICATIONS

Wilson, "Using Current Conveyor's", *Electronics & Wireless World*, Apr. 1986, pp. 28-32.
Wilson, "A New Look at Gain-Bandwidth Product", *Electronics & Wireless World*, Aug. 1987, pp. 834-836.

*Primary Examiner*—James B. Mullins
*Attorney, Agent, or Firm*—Bernard Franzblau

[57] ABSTRACT

A broadband signal amplifier includes a current conveyor (2) having a current control input (X), a voltage control input (Y) and an output (6). Signal control is provided at the current control input (X) and a feedback circuit (24, 25) is provided from the output to the current control input mainly for the lower signal frequencies. Signal control is also provided at the voltage control input (Y) and a capacitive impedance (23) is connected to the current control input mainly for the higher signal frequencies.

20 Claims, 3 Drawing Sheets

BROADBAND SIGNAL AMPLIFIER

BACKGROUND OF THE INVENTION

This invention relates to a broadband signal amplifier having at least a partial pole-zero compensation, more particularly to a broadband signal amplifier which comprises feedback means.

A broadband signal amplifier of this type is known from EP-A 0,314,218, which corresponds to U.S. Pat. No. 4,872,209 (Oct. 3, 1989) and is suitable for use in, for example, measuring apparatus, communication apparatus, medical apparatus, high-definition television circuits, circuits for color graphic display devices and computer monitors, and, for amplifier circuits for amplifying signals sampled at high sampling frequencies in digital apparatus.

The known broadband signal amplifier comprises, inter alia, a transimpedance amplifier having a low-ohmic current input and an output from which an output voltage can be derived. The transimpedance amplifier is negatively current fed back to the low-ohmic current input so that specific resonant frequencies produced by parasitic capacitances in the transfer function of the transimpedance circuit acquire a higher value and the bandwidth is increased. The broadband signal amplifier also comprises a transadmittance circuit connected to the input of the transimpedance amplifier. The bandwidth is further increased by suitably compensating the first-order decrease of the transfer function of the transimpedance amplifier with a first-order increase of the transfer function of the transadmittance circuit.

A drawback of the known broadband signal amplifier is that the use of the current control requires a powerful driver which is generally adjusted in class A and which dissipates a lot of energy, while a possible adjustment in class B requires many electronic components in the driver.

SUMMARY OF THE INVENTION

It is an object of the invention to provide a simpler broadband amplifier circuit which dissipates relatively little power and has such a broad band that it can amplify signals to approximately 30 to 40 MHz while using a minimum quantity of electronic components.

According to the invention the broadband signal amplifier described in the opening paragraph is therefore characterized in that the broadband signal amplifier comprises a current conveyor having a current control input (X), a voltage control input (Y) and an output (Z) and in which it substantially holds for the alternating current (i) and the alternating voltage (v) at the control inputs (X, Y), and the output (Z) that:

$$\begin{array}{c} i_y \\ v_x \\ i_z \end{array} = \begin{array}{ccc} 0 & 0 & 0 \\ A & 0 & 0 \\ 0 & G & 0 \end{array} \cdot \begin{array}{c} v_y \\ i_x \\ v_z \end{array}$$

with a current transfer function G and a voltage transfer function A, in that the broadband signal amplifier comprises current control means for controlling the current control input (X) with the signals to be amplified and voltage control means for controlling the voltage control input (Y) with the signals to be amplified, in that the output (Z) is coupled to the current control input (X) via the feedback means and in that a capacitive impedance is arranged between the current control input (X) and a point of common potential for the at least partial pole-zero compensation. The voltage transfer function A will generally be substantially 1.

One aspect of the broadband signal amplifier according to the invention is the use of a combined voltage-current control. On the one hand the advantages provided by the great accuracy for low frequencies of current control with a negative feedback are maintained. On the other hand the control by means of voltage control is very simple and it is simply possible to generate sufficient current at the current control input (X) for the high frequencies. By using the current conveyor, the broadband signal amplifier according to the invention is simple because the current conveyor makes it possible to influence the output signal supplied by the current conveyor in dependence upon control signals at the relevant control inputs by simultaneous current-voltage control at the relevant control inputs.

The object of the capacitive impedance is to provide the required current at the input (X), notably to enable the transfer from the input (Y) to the output (Z) particularly for frequencies which are located in a high-frequency part of the passband of the broadband signal amplifier. In the case of voltage control at the voltage control input (Y), the relevant voltage $V_y$ is copied by the current conveyor to a voltage $V_x$ at the X input, which voltage $V_x$, given the capacitive impedance, causes a specific current to flow to the X input which, together with a current to be supplied by the current control means, produces an ultimate current $i_x$ which, multiplied by G, causes an output current $i_z$ to flow in the parasitic load capacitance Cpar.

This capacitive impedance has substantially no influence on frequencies which are located in the low-frequency part of the passband of the broadband signal amplifier. The pole which is located in the transfer characteristic of the broadband signal amplifier can be compensated by a zero in this characteristic due to the capacitive impedance as regards the transfer from the voltage control input (Y) to the output (Z), so that a broadband signal amplifier passband which is substantially flat up to high frequencies is possible. It was found that the maximum bandwidth of the broadband signal amplifier is then determined by a pole in the frequency-dependent current transfer function G. However, this pole is at a high frequency of the order of 30 to 40 MHz.

By adjusting the value of the capacitive impedance, the frequency of the zero in the transfer characteristic of the broadband signal amplifier can be simply influenced so that the pole-zero compensation can be realised. Moreover, by influencing the capacitance, the step response, particularly its last part as viewed in time, is influence. An advantage of the use of a capacitor for the capacitive impedance is that the maximum current to be supplied via the capacitor to the current control input (X) is not limited. This has the advantage that desired large voltage steps per unit of time are feasible at the output.

A very simple embodiment of the broadband signal amplifier according to the invention is characterized in that the current conveyor is a transistor whose emitter constitutes the current control input (X), the base constitutes the voltage control input (Y) and the collector constitutes the output (Z) of the current conveyor.

This embodiment, for which the absolute value of the current transfer function G is smaller than 1, comprises one transistor only. Given the value of the current amplification factor of the relevant transistor, G will be approximately 0.98.

Another embodiment of the broadband signal amplifier according to the invention is characterized in that the absolute value of the current transfer function G is larger than or equal to 1.

The advantage of this embodiment of the broadband signal amplifier according to the invention is that the current conveyor thereby partly functions as a current amplifier so that the current at the current control input may be lower than the output current of the current conveyor, which reduces its dissipation.

A third embodiment of the broadband signal amplifier according to the invention is characterized in that the feedback means comprise DC feedback means.

The advantage of this third embodiment of the broadband signal amplifier according to the invention is that using DC feedback and influencing the extent of DC feedback can influence the amplification of the signals occurring in the low-frequency part of the passband of the broadband signal amplifier without this having any influence on the amplification of signals in the high-frequency part of the passband of the broadband signal amplifier. Moreover, the specific frequency value at which the pole occurs in the transfer characteristic of the broadband signal amplifier, can be influenced by means of the value of the DC negative feedback.

A fourth embodiment of the broadband signal amplifier according to the invention is characterized in that the feedback means additionally comprise AC feedback means, for example, a capacitor arranged parallel to the DC negative feedback means. The stability of the fed-back broadband signal amplifier can be optimized by the choice of the capacitance of this capacitor.

A fifth embodiment of the broadband signal amplifier according to the invention is characterized in that the voltage control input (Y) is coupled to one side of the main current path of a voltage control means implemented with at least one semiconductor element with a control electrode, and to a power supply point via a resistor, and in that the current control input (X) is coupled to one side of the main current path of a current control means implemented with at least one semiconductor element having a control electrode, in that the other sides of the main current paths are interconnected via resistance means to which one side of a DC source is connected, said DC source having its other side connected to a point of common potential, and in that at least one of the two control electrodes of the semiconductor element in the current control means and the semiconductor element in the voltage control means is coupled to an input terminal of the broadband signal amplifier.

This fifth embodiment of the broadband signal amplifier according to the invention has the advantage that the only connection between the current conveyor and the point of common potential extends via the coupled main current paths so that it is simple to control the control inputs on the one hand and the output of the broadband signal amplifier on the other hand with mutually different values of the common supply potential.

The resistor makes it possible to influence the DC working point of the current-voltage control means and the amplification factor in the high part of the passband. Moreover, the instantaneous short-circuit of this resistor provides the possibility of limiting an increased power dissipation which accompanies a possible overload of the broadband signal amplifier without the amplification in the low part of the passband of the broadband signal amplifier being influenced. When the amplifier is used in television receivers, the so-called dark current stabilization is not influenced.

With these resistance means, the total amplification of the fed-back broadband signal amplifier can be simply controlled without this influencing the bandwidth of the amplifier as a whole. This possibility is particularly important for calibration purposes for influencing the so-called white point calibration.

A sixth embodiment of the broadband signal amplifier according to the invention is characterized in that the broadband signal amplifier comprises a buffer amplifier whose input is coupled to the output of the current conveyor and whose output is coupled to the feedback means. When the buffer amplifier is loaded, the load at the output of the current conveyor is thereby limited to some extent so that the load on the current conveyor is decreased. This notably applies to the current for the feedback means, which current is now supplied by the output of the buffer amplifier, but this also applies to, for example, a capacitive load current as is derived, for example, from the output by a picture display tube. The buffer amplifier also provides the possibility of simply measuring the beam current which is taken up by such a picture display tube.

A seventh embodiment of the broadband signal amplifier according to the invention is characterized in that the output of the current conveyor has a current sourcing output and a current sinking output and the buffer amplifier has corresponding inputs coupled to the respective outputs, said corresponding inputs being coupled to respective control electrodes of first and second semiconductor elements incorporated in the buffer amplifier. Furthermore, main current paths of the first and second semiconductor elements are mutually arranged in series via a third semiconductor element, one side of the third semiconductor element constituting the output coupled to the feedback means and the other side of the third semiconductor element constituting a further output for supplying or taking up a load current. The control electrodes of the first and the second semiconductor element are adjusted in such a way that on the one hand a current to be supplied by the one main current path and to be taken up by the feedback means and on the other hand a beam current to be supplied by the load and to be taken up by the second semiconductor element are separated from each other by means of the third semiconductor element. Moreover, the other side of the main current path of the second semiconductor element is coupled to an information output for providing information about the beam current supplied by the load.

An advantage of this embodiment is that the feedback current to be supplied to the feedback means does not disturb the current to be taken up from the load so that accurate information is supplied to the information output about the current taken up by the load, which is of great importance in connection with beam current stabilization, particularly when using a picture display tube as a load. Moreover, the relevant output of the broadband signal amplifier is capable of supplying both the capacitive charge current and the discharge current. A further advantage of this embodiment is that it has a low output impedance and requires a minimum quantity of electric components to function efficiently, because no special active components, required for measuring the beam current in the picture display tube, are necessary in the broadband signal amplifier.

BRIEF DESCRIPTION OF THE DRAWING

The invention and its further advantages will be described in greater detail with reference to the accompanying drawings in which similar elements have identical reference numerals or reference symbols.

In these the drawings.

DESCRIPTION OF THE PREFERRED EMBODIMENTS

Figure 1:
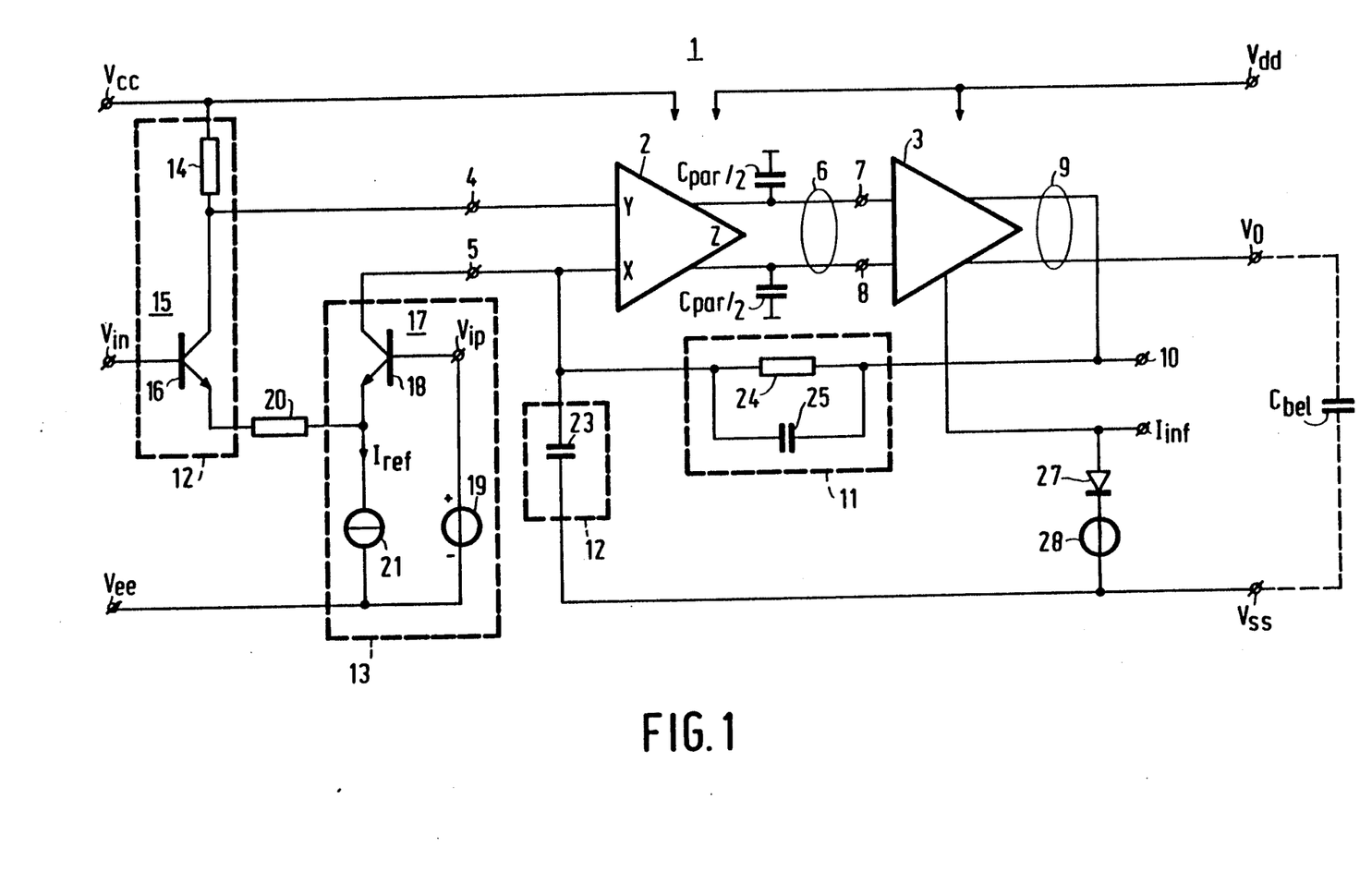
FIG. 1 shows a preferred embodiment of the broadband signal amplifier according to the invention.

FIG. 1 shows a detailed embodiment of a broadband signal amplifier 1. The broadband signal amplifier 1 has an input terminal $V_{in}$ and an output terminal $V_o$. A broadband signal, for example, a video signal is available at terminal $V_{in}$, which signal is supplied by further electronic means which are not shown. The broadband signal amplifier 1 amplifies the input signal at terminal $V_{in}$ and supplies an output signal at terminal $V_o$. A picture display tube which is not further shown may be connected to terminal $V_o$.

The broadband signal amplifier 1 comprises a current conveyor 2 and, if desired, a buffer amplifier 3. The current conveyor 2 has a (voltage) control input terminal 4 and an input terminal 5, as well as an output 6. In the embodiment shown in FIG. 1 the broadband signal amplifier 1 comprises the buffer amplifier 3 which couples the output 6 to the output terminal $V_o$. However, the use of the buffer amplifier 3 is by no means necessary because output 6 may be alternatively connected directly to output terminal $V_o$. In the embodiment shown the current conveyor 2 has an output 6 which is implemented as a combination of an output 7 supplying a current and an output 8 taking up a current (these outputs are also referred to as a "current sourcing" output and a "current sinking" output). The buffer amplifier 3 to be described hereinafter of course has inputs which correspond to these outputs 7 and 8. The buffer amplifier 3 has an output 9 one branch of which is connected to the control input terminal 5 via terminal 10 and via feedback means 11, and the other branch of which constitutes the output terminal $V_o$.

Voltage control means 12 are connected to voltage control input terminal 4 and current control means 13 are connected to input terminal 5. If desired, voltage and current control takes place simultaneously, but by means of separate means 12 and 13.

Like the current conveyor 2, the voltage control means 12 are connected to a point of the power supply voltage, namely $V_{cc}$. The voltage control means 12 are provided with a resistor 14 connected to the power supply voltage $V_{cc}$ and with a semiconductor element 15 which has a control electrode 16 connected to the input terminal $V_{in}$. The semiconductor element 15, has a main current path in the form of a collector-emitter circuit. The collector of the semiconductor element 15', implemented as a transistor, is connected to the resistor 14 and to the terminal 4.

The current control means 13 comprise a semiconductor element 17 with a control electrode 18 which is connected to a reference voltage source 19. The semiconductor element 17, implemented as a transistor, has a collector-emitter circuit which constitutes the main current path of the semiconductor element. The collector of the semiconductor element 17 is connected to the input terminal 5, while the emitter of the element 17 is coupled to the emitter of the semiconductor element 15 (transistor) via a resistance means which are denoted by means of a resistor 20. The junction point of the main current paths of the semiconductor elements 15 and 17 is connected to a current source 21 at the location of the emitter of the semiconductor element 17, which current source supplies a generally adjustable direct current Iref. The two sources 19 and 21 incorporated in the current control means 13 are connected to a common potential terminal $V_{ee}$ of the power supply voltage.

If so desired, the terminal $V_{in}$ may be connected to the control electrode 18 and the terminal $V_{ip}$ may be connected to the control electrode 16. This does not influence the operation of the broadband signal amplifier 1, which operation will be described hereinafter.

In the embodiment shown in FIG. 1 the broadband signal amplifier 1 comprises further control means in the form of a capacitor 23. The capacitor is connected at one end to the input terminal 5 and at the other end to a terminal $V_{ss}$ of a further power supply voltage. The terminal $V_{dd}$ also forms a part of this further power supply voltage. The terminal $V_{dd}$ partly provides the current conveyor 2 with a required power supply voltage and further provides the buffer amplifier 3 with the required power supply voltage.

The broadband signal amplifier 1 shown also comprises current feedback means incorporated in the feedback means 11 and denoted by means of a resistor 24 in FIG. 1, and also comprises AC feedback means which are denoted by means of a capacitor 25 arranged parallel to the resistor 24. The buffer amplifier 3 is connected to a terminal $I_{inf}$, which terminal $I_{inf}$ is connected to terminal $V_{ss}$ of the further power supply voltage via a diode 27 and a voltage source 28'.

If the alternating current flowing to control input (X) is denoted by $i_x$ and the alternating voltage at control input (X) is denoted by $v_x$ and if the other alternating currents and alternating voltages at control input (Y) and output (Z) are denoted by $i_y$, $v_y$, $i_z$ and $v_z$, respectively, the following relation between these magnitudes can be given:

$$\begin{matrix} i_y \\ v_x \\ i_z \end{matrix} = \begin{matrix} 0 & 0 & 0 \\ 1 & 0 & 0 \\ 0 & G & 0 \end{matrix} \cdot \begin{matrix} v_y \\ i_x \\ v_z \end{matrix}$$

in which G is the current transfer function. This relation is characterized by the following equations:

$$i_y = 0, \; v_x = v_y, \; i_z = Gi_x.$$

These relations characterize the operation of the current conveyor 2. More details can be derived from two articles published by B. Wilson in "Electronics and Wireless World". The first article entitled "Using Current Conveyors" was published on pages 28-32 in April 1986; the second article entitled "A New Look At Gain Bandwidth Product" was published on pages 834-836 in August 1987. In the first-mentioned article the value assumed by the current transfer function is limited to +1.

Figure 2:
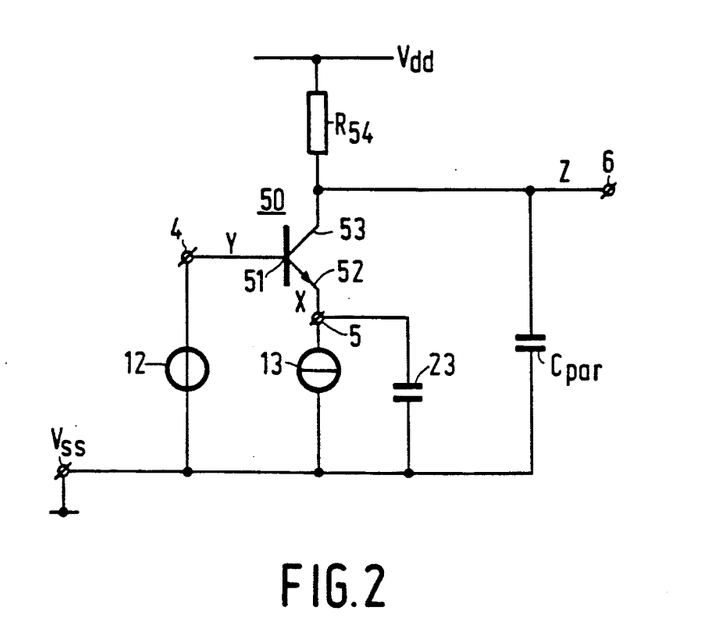
FIG. 2 shows a very simple embodiment of a current conveyor for use in the broadband signal amplifier according to FIG. 1.

A very simple embodiment of such a current conveyor is shown in FIG. 2. In this embodiment a transistor 50 functions as a simple current conveyor. Its base 51 constitutes the (voltage) control input (Y) and is connected to (voltage) control input terminal 4 to which the voltage control means 12 are connected. The emitter 52 of the transistor 50 constitutes the current control input (X) and is connected to a parallel circuit of the current control means 13 and the capacitor 23. The collector 53 constitutes the Z output of the current conveyor. It has a resistor R54 connected to the power supply voltage $V_{dd}$ and a capacitor Cpar, which constitutes the combination of the parasitic capacitance of the transistor 50, the connection paths and the load connected to the terminal 6.

Figure 3:
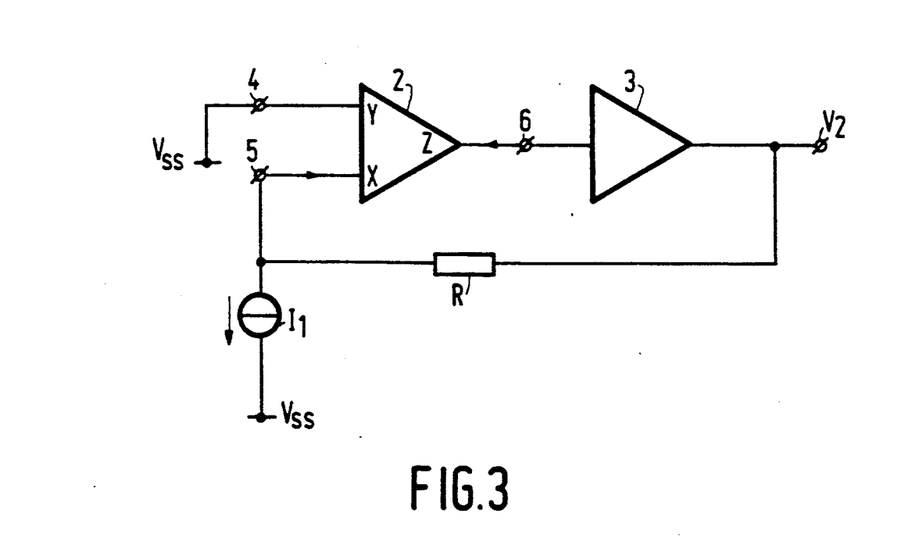
FIG. 3 shows an example of current control to explain the operation of the current conveyor used in the broadband signal amplifier according to FIG. 1.

The operation of "current conveyors" will now be described in greater detail with reference to FIGS. 3 and 4. FIG. 3 shows a diagram of an amplifier circuit in which a feedback resistor R is arranged between output $V_2$ of the buffer amplifier 3 and input terminal 5 of the current conveyor 2. Input 4 is connected to ground and a current source $I_1$ is connected between the input terminal 5 and terminal $V_{ss}$. The buffer amplifier 3 ensures that the current $i_z$ and hence also the current $i_x$ are sufficiently small. For the diagram of FIG. 3 it then holds that $V_2 = R \cdot I_1$. The circuit is current controlled and negatively fed back, which favorably influences the DC behavior and the behavior at low frequencies. Furthermore, the output voltage $V_2$ accurately follows the input current $I_1$.

Figure 4:
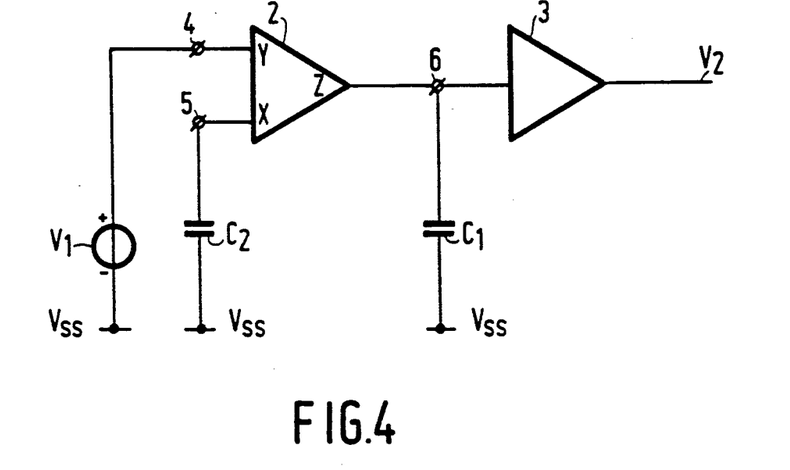
FIG. 4 shows an example of voltage control to explain the operation of the current conveyor used in the broadband signal amplifier according to FIG. 1.

However, FIG. 4 shows a diagram in which the direct control at the current control input 5 is replaced by a control at the voltage control input 4 by means of a voltage source $V_1$ connected between input 4 and terminal $V_{ss}$. A capacitor $C_2$ is connected between input 5 and terminal $V_{ss}$, and a capacitor $C_1$ is connected between output 6 and terminal $V_{ss}$. For the diagram of FIG. 4 it holds that: $V_2 = G \cdot C_2/C_1 \cdot V_1$. This circuit has a feedforward and no negative feedback. Consequently, no loop stability problems occur herein so that the circuit has a favorable behavior at high frequencies.

Where the operation of the diagram of FIG. 3 is self-evident, given the comparisons of the current conveyor, the following is to be noted with reference to FIG. 4. Here it holds that: $V_x = V_y = V_1$. Thus, the combination of the impressed voltage $V_1$ and the capacitor $C_2$ will produce a current in the latter which will flow in input X and which, multiplied by the current amplification factor G, will be subsequently copied at the output Z. This output current flows through capacitor $C_1$ so that a voltage corresponding to the voltage $V_1$ is produced across this capacitor, which voltage becomes available as a voltage $V_2$ after it has been processed by the buffer amplifier 3. The operation of the diagrams shown separately in FIGS. 3 and 4 has now been explained, while it is to be noted that each of these two forms of current and voltage control have their specific advantages, the voltage control being specially suitable for the higher frequencies and the current control being suitable for the lower frequencies.

These advantages are combined when using the broadband signal amplifier 1 shown in FIG. 1. In fact, a simultaneous voltage and current control takes place in this amplifier. Viewed from terminal $V_{in}$, voltage control is effected by means of the voltage control means 12, while the current conveyor 2 copies the voltage at input 4 to input X and this copied voltage together with capacitor 23 produces a current to input X which, multiplied G times, becomes available at output 6 and is further passed on to Cpar. Again viewed from terminal $V_{in}$, current control is effected via resistor 20 and the current control means 13, while in addition to the current to input X brought about by the voltage control, the current to input X is directly influenced by means of the current control means 13. This combination of voltage and current control leads to a very simple circuit of the broadband signal amplifier 1. Moreover, the separate advantages of each of these controls are completely maintained in the circuit of FIG. 1. The result is that this combined control enables an amplification to very high frequencies of the order of 30 to 40 MHz when using a suitable pole-zero compensation. This will be further described hereinafter.

Based on the above-mentioned relations for the current conveyor 2, further calculations have been made for the circuit of the broadband signal amplifier 1 of FIG. 1, which led to $$V_o(p) = -(V_{in}(p) - V_{ip}(p)) \frac{(R14 + R24)}{R20} \cdot \frac{1 + p(R14//R24)(C23 + C25)}{1 + p \cdot R24(C25 + Cpar/G)}$$

In this relation p represents the laplace operator, $V_{ip}(p)$ is the voltage supplied by the reference voltage source 19 and Cpar is the capacitive load at output 6 of the current conveyor 2. Cpar is of the order of several pFs up to approximately 20 pF. Cpar includes the parasitic capacitances which are produced by the transistors in the output 6 and by the input stage of the buffer amplifier 3. Furthermore, Cpar includes the wiring capacitances. Otherwise the resistors and capacitors are denoted in the conventional way. The factor expressed by the influence of a variation of the power supply voltage $V_{cc}$ on the output voltage $V_o$ as well as the factor expressing the influence of a variation of Iref on $V_o$ is not incorporated in this relation. It is important to note that the following relation generally holds for the current transfer function G $$G = \frac{G0}{1 + pTg}$$

In this expression G0 represents the value of G at the zero frequency and Tg is the time constant above which a 20 dB per decade decay of G can be observed. The value of the pole in the transfer function G is located at high frequencies, in practice at frequencies which are higher than 30 MHz.

It appears in practice that the factor R24/R20 is related to the current control by the current control means 13. This factor also determines the DC behavior of the broadband signal amplifier 1.

The denominator in the above-mentioned expression for $V_o(p)$ has a first-order pole at a frequency value which in practice is approximately 3 MHz. The second-order pole which is present in this expression is determined by the pole in the transfer function G. This pole is located at a frequency value which is higher than 30 MHz.

The numerator in the above-mentioned expression for the broadband signal amplifier 1 has a zero. By rendering the value of pole and zero equal to each other, a pole-zero compensation can be realized so that the passband of the broadband signal amplifier 1 is considerably increased and is only limited at its upper side by the pole in the current transfer function G located at 30 to 40 MHz.

While omitting the afore-mentioned factors and assuming that $R24 > R14$ and $C23 > C25$, the above-mentioned relation for the voltage transfer function H(p) can be written as:

$$H(p) = \frac{V_o(p)}{V_{in}(p) - V_{ip}(p)} = -\frac{R24}{R20} \cdot \frac{1 + p \cdot R14 \cdot C23}{1 + p \cdot R24 \cdot (C25 + C_{par}/G)}$$

The following can be noted on the basis of this practical relation:

1. As already explained, a zero can be recognized in the numerator and a pole can be recognized in the denominator. The different components indicated in this relation can be given such values that pole and zero compensate each other. In practice this compensation will take place at approximately 3 MHz.

2. The ultimate bandwidth is then mainly determined by the pole in the transfer function G. However, as already previously noted, this pole is at approximately 30 to 40 MHz. Thus, the bandwidth will also extend to these high frequencies in the case of voltage control of the broadband signal amplifier 1.

3. The total amplification can be adjusted by means of the resistance value of R20. It can be used, for example, for the so-called white D calibration.

4. The resistor R14 and the capacitors C23 and C25 only determine the high-frequency amplification. One of these afore-mentioned components can be used for realising pole-zero compensation. It is preferred to realise pole-zero compensation by adjusting C23 because R14 influences the DC working point. In practice it has been found to be favorable to utilize C25 for realising an optimum stability because the value of C25 determines the high-frequency feedback factor. If C23 is not suitably adjusted, the step response exhibits a so-called tail and lasts too long, which is undesirable.

5. It has been found to be advantageous in practice to create the possibility of short-circuiting the resistor R14 under given circumstances. This limits the bandwidth and the power dissipation without affecting the amplification in the low frequency part of the passband of the broadband signal amplifier 1. This results from the fact that the current conveyor is adjusted in class AB. This possibility is used when realising a protection against overload if a signal comprising many higher frequency components is processed by the broadband signal amplifier for a longer period. The additional advantage is that the so-called dark current stabilization is not affected when the amplifier is used in television sets.

6. The current through the load Cpar is predominantly generated in a forward manner and derived from the current through C23. The current through C23, which is impressed by the voltage at the voltage control input 4 of the current conveyor 2, is copied in the current conveyor. In this case as much current can flow through the capacitor C23 as is required to supply the desired load current. C23 does not impose an upper limit on the current which can be supplied to the current control input 5. The use of C23 therefore ensures that a sufficient current can be supplied to the current conveyor 2 so as to overcome the slew-rate problems which are caused by the load. This is notably important if the load is constituted by said parasitic capacitances at which peak currents up to 200 mA may occur and which under given circumstances at the current conveyor 2 are derived from or supplied to the output 6. By way of example, a slew-rate of 10 kV per μs can be considered when using the broadband signal amplifier 1 as a video amplifier, at a practical load of approximately 20 pF, which then requires an output peak current of approximately 200 mA.

7. As the absolute value of the transfer function G is greater than 1, an accordingly smaller part of the current to be supplied by the output 6 to the load will flow through the current control input terminal 5. In the practical case where it holds that G=6, the maximum peak current to be supplied to the current control input 5 will be approximately 33 mA. A further advantage of making the absolute value of the transfer function G larger than 1 is that it will be immediately clear from the above-mentioned relations that the influence of Cpar on the voltage $V_o(p)$ will be smaller as G is larger because the division factor Cpar/G then also has a smaller value.

The only connection between the control means 12, 13 and the current conveyor 2 extends via the collectors of the semiconductor elements 15 and 17, while the sum of the currents through the respective main current paths is constant and is equal to Iref. As a result it is comparatively easy to relate the relevant input signals at the control inputs X, Y on the one hand and the output signal at the output 6 on the other hand to two different ground potentials. FIG. 1 shows that the current conveyor 2 is supplied via power supply terminals $V_{dd}$, $V_{cc}$ and $V_{ss}$. The control means are connected to ground at $V_{ee}$. The arrangement of the control means 12 and 13 as explained hereinbefore has a further important advantage regarding its possible use as a reducing circuit for signals which are applied via terminal $V_{in}$.

Figure 5:
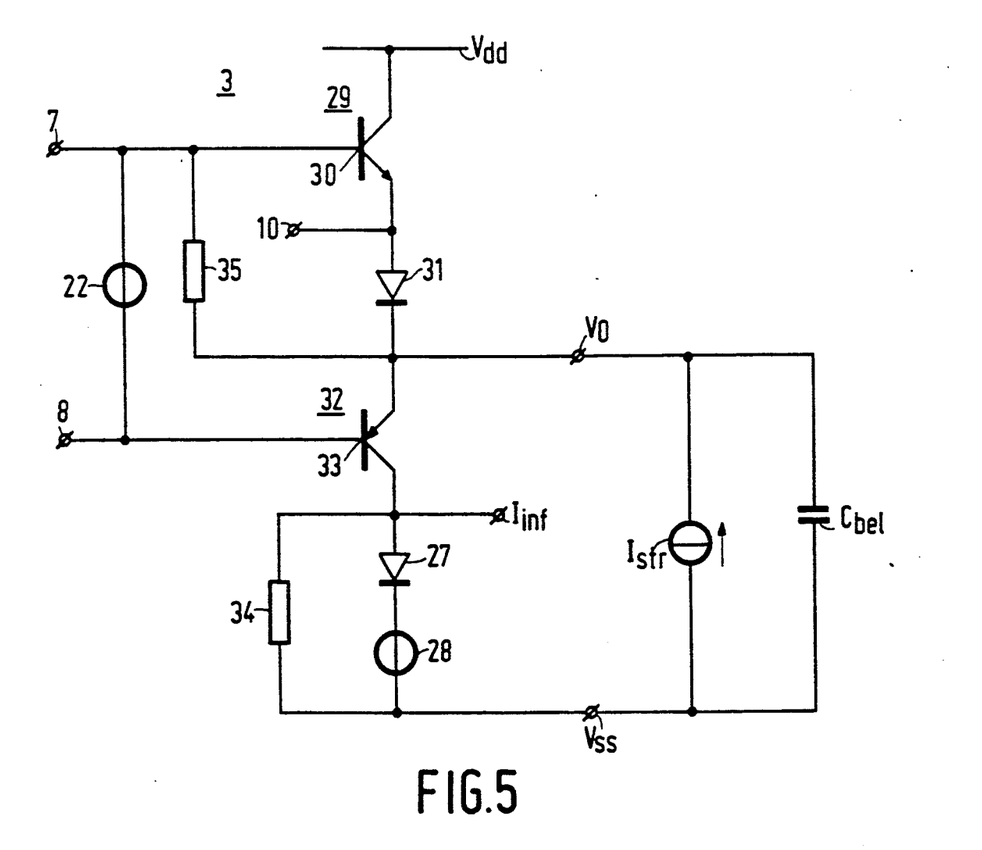
FIG. 5 shows a possible embodiment of the buffer amplifier for use in the broadband signal amplifier according to FIG. 1.

FIG. 5 shows a possible embodiment of the buffer amplifier 3 for use in the broadband signal amplifier as incorporated in FIG. 1. Between the terminals $V_{dd}$ and $V_{ss}$, the buffer amplifier 3 shown comprises a series arrangement of, successively, a semiconductor element 29 with control electrode 30, a semiconductor element shown as a diode 31, a semiconductor element 32 with a control electrode 33, the diode 27 and the voltage source 28. A resistor 34 is further arranged between terminal $I_{inf}$ and terminal $V_{ss}$. The semiconductor elements 29 and 32 are transistors which are shown in known manner in FIG. 5. Control electrode 30 is connected to the current sourcing output 7 of the current conveyor 2 and control electrode 33 is connected to the current sinking output 8 of the current conveyor 2.

Current is supplied to the load Cbel via the main current path of the semiconductor element 29 and the diode 31, i.e. via the collector-emitter circuit which is arranged in series with the diode 31. When current is supplied to the load Cbel, the diode 31 passes the relevant load current. Deriving current from the load Cbel results in a current flowing via the main current path of the semiconductor element 32, i.e. via the collector-emitter circuit of the semiconductor element 32 and to terminal $V_{ss}$ via the resistor 34 and the diode 27 and source 28.

It is important to note that in the case where a picture display tube is used as a load, this tube supplies a current to the terminal $V_o$, which current flows to the terminal $I_{inf}$ via the collector-emitter circuit of the transistor 32 and subsequently via the resistor 34. The supply of beam current by the load is shown diagrammatically by means of a current source Istr. It is important that this beam current can be measured because it is a measure of the intensity of the electron beam. The signal at terminal $I_{inf}$ therefore provides information about the magnitude of the beam current which is used for establishing beam current stabilization and peak beam current limitation.

If desired, a resistor 35 supplying an extra positive leakage current to the load may be arranged between output 7 and terminal $V_o$ so that the broadband signal amplifier 1 is suitable to cooperate with picture display tubes of a type having impregnated so-called I cathodes.

Feedback current is supplied to the feedback means 11 via terminal 10, while this current, which is generally orders larger than the beam current, is not to disturb the measurement of the beam current. The circuit of FIG. 5 makes it possible to simply measure the beam current at terminal $I_{inf}$ without it being disturbed by the feedback current to terminal 10. For this purpose it is necessary that the DC bias voltages between the current sourcing output 7 and the current sinking output 8 are such that the difference between these voltages is smaller than three junction voltages, i.e. smaller than approximately $3 \times 0.6$ V, because otherwise an unwanted quiescent current will start to flow through the series arrangement of the collector-emitter circuit of the transistors 29 and 32 and the diode 31. On the other hand the difference between these voltages should be larger than one junction voltage for a satisfactory operation of the leakage current compensation by the resistor 35. This difference is preferably two junction voltages, i.e. approximately $2 \times 0.6$ V. DC voltage means 22 providing the desired junction voltage is arranged between the outputs 7 and 8.

I claim:

1. A broadband signal amplifier having at least a partial pole-zero compensation, said broadband signal amplifier comprising: feedback means, a current conveyor having a current control input (X), a voltage control input (Y) and an output (Z) and in which for an alternating current (i) and an alternating voltage (v) at the control inputs (X, Y) and the output (Z):

$$\begin{array}{c} i_y \\ v_x \\ i_z \end{array} = \begin{array}{ccc} 0 & 0 & 0 \\ A & 0 & 0 \\ 0 & G & 0 \end{array} \cdot \begin{array}{c} v_y \\ i_x \\ v_z \end{array}$$

with a current transfer function G and a voltage transfer function A, current control means for controlling the current control input (X) with signals to be amplified and voltage control means for controlling the voltage control input (Y) with the signals to be amplified, means coupling the output (Z) to the current control input (X) via the feedback means, and a capacitive impedance coupled between the current control input (X) and a point of common potential for at least partial pole-zero compensation.

2. A broadband signal amplifier as claimed in claim 1, wherein the current conveyor comprises a transistor whose emitter constitutes the current control input (X), whose base constitutes the voltage control input (Y), and having a collector that constitutes the output (Z) of the current conveyor.

3. A broadband signal amplifier as claimed in claim 1, wherein the absolute value of the current transfer function G is larger than or is equal to 1.

4. A broadband signal amplifier as claimed in claim 3 wherein the feedback means comprise DC feedback means.

5. A broadband signal amplifier as claimed in claim 4, wherein the feedback means additionally comprise AC feedback means.

6. A broadband signal amplifier as claimed in claim 5 wherein the voltage control input (Y) is coupled to one terminal of a main current path of the voltage control means comprising at least one semiconductor element having a control electrode, and to a power supply point via a resistor, and the current control input (X) is coupled to one terminal of a main current path of the current control means comprising at least one semiconductor element having a control electrode, means interconnecting the other terminals of the main current paths via resistance means to which one terminal of a DC source is connected, said DC source having its other terminal connected to a point of common potential, and wherein at least one of the control electrodes of the semiconductor element in the current control means and the semiconductor element in the voltage control means is coupled to an input terminal of the broadband signal amplifier.

7. A broadband signal amplifier as claimed in claim 1, wherein said coupling means comprises a buffer amplifier having an input coupled to the output of the current conveyor and an output coupled to the feedback means.

8. A broadband signal amplifier as claimed in claim 7, wherein the output of the current conveyor comprises a current sourcing output and a current sinking output, and the buffer amplifier comprises corresponding inputs coupled to the respective current conveyor outputs, said corresponding inputs being coupled to respective control electrodes of first and second semiconductor elements in the buffer amplifier, wherein main current paths of the first and second semiconductor elements are mutually connected in series via a third semiconductor element, one terminal of the third semiconductor element constituting the buffer amplifier output coupled to the feedback means and an other terminal of the third semiconductor element constituting a further output for supplying or taking up a load current, the control electrodes of the first and the second semiconductor element being adjusted such that a current to be supplied by the one main current path and to be taken up by the feedback means and a beam current to be supplied by the load and to be taken up by the second semiconductor element are separated from each other by means of the third semiconductor element, and means coupling the main current path of the second semiconductor element to an information output for providing information about the beam current supplied by the load.

9. A broadband signal amplifier as claimed in claim 7, wherein the output of the current conveyor comprises a current sourcing output and a current sinking output coupled to first and second inputs of the buffer amplifier which comprise said buffer amplifier input, and wherein said buffer amplifier comprises;

a first transistor, a semiconductor element and a second transistor connected in series to a source of DC supply voltage, means coupling a control electrode of the first transistor and a control electrode of the second transistor to said first and second buffer amplifier inputs, respectively, and means coupling a first terminal of the semiconductor element to said buffer amplifier output and a second terminal thereof to a further output for connection of a load.

10. A broadband signal amplifier as claimed in claim 9 wherein said second transistor is connected so as to pass a current supplied by the load via said further output and said semiconductor element is operative to separate a current supplied by the first transistor to the feedback means from said load supplied current.

11. A broadband signal amplifier as claimed in claim 10 wherein the buffer amplifier further comprises a signal output coupled to said second transistor so as to provide a signal indicative of the current supplied by the load.

12. A broadband signal amplifier as claimed in claim 11 wherein the buffer amplifier further comprises;

a resistor coupled between the buffer amplifier first input and further output, a second semiconductor element connected in series circuit with a voltage source and said second transistor and with said signal output coupled to a junction point between the second transistor and the series circuit of the second semiconductor element and the voltage source.

13. A broadband signal amplifier as claimed in claim 1 wherein the feedback means comprise DC feedback means.

14. A broadband signal amplifier as claimed in claim 13 wherein the feedback means additionally comprise AC feedback means.

15. A broadband signal amplifier as claimed in claim 1 wherein the voltage control input (Y) is coupled to one terminal of a main current path of the voltage control means comprising at least one semiconductor element having a control electrode, and to a power supply point via a resistor, and the current control input (X) is coupled to one terminal of a main current path of the current control means comprising at least one semiconductor element having a control electrode, means interconnecting the other terminals of the main current paths via resistance means to which one terminal of a DC source is connected, said DC source having its other terminal connected to a point of common potential, and wherein at least one of the control electrodes of the semiconductor element in the current control means and the semiconductor element in the voltage control means is coupled to an input terminal of the broadband signal amplifier.

16. A broadband signal amplifier comprising:

a current conveyor having a current control input (X), a voltage control input (Y) and an output (Z) and with a current transfer function G and a voltage transfer function A, wherein for a current (i) and a voltage (v) at the conveyor control inputs (X, Y) and the output (Z) the operation of the current conveyor is defined by the following relationship:

$$\begin{pmatrix} i_y \\ v_x \\ i_z \end{pmatrix} = \begin{pmatrix} 0 & 0 & 0 \\ A & 0 & 0 \\ 0 & G & 0 \end{pmatrix} \cdot \begin{pmatrix} v_y \\ i_x \\ v_z \end{pmatrix}$$

current control means coupled to said current control input (X) for controlling said input (X) with a signal to be amplified, voltage control means coupled to said voltage control input (Y) for controlling said input (Y) with the signal to be amplified, means coupling the output (Z) to the current control input via a feedback circuit, and a capacitive impedance coupled between the current control input (X) and a point of common potential.

17. A broadband signal amplifier as claimed in claim 16 wherein said current transfer function $G \geq 1$ and said feedback circuit comprises a parallel RC circuit.

18. A broadband signal amplifier comprising:

a current conveyor having a current control input (X), a voltage control input (Y) and an output (Z) and with a current transfer function G and a voltage transfer function A, current control means coupled to said current control input (X) for supplying thereto a signal to be amplified, voltage control means coupled to said voltage control input (Y) for supplying thereto a signal to be amplified, means coupling the output (Z) to the current control input via a feedback circuit, a capacitive impedance coupled between the current control input (X) and a point of common potential, wherein the voltage control means comprises a first transistor having one main electrode coupled to the voltage control input (Y) and via a first resistor to a terminal of a source of DC supply voltage, and said current control means comprises a second transistor having one main electrode coupled to the current control input (X), a second resistor interconnecting second main electrodes of the first and second transistors, a DC current source connected in series with the first transistor and the second transistor to a point of common potential such that the sum of the currents in the first and second transistors is constant, and wherein a control electrode of at least one of said first and second transistors is coupled to a signal input terminal of the broadband signal amplifier.

19. A broadband signal amplifier as claimed in claim 18 wherein a control electrode of the other one of said first and second transistors is coupled to a reference voltage terminal.

20. A broadband signal amplifier as claimed in claim 18 wherein said feedback circuit comprises a third resistor and a second capacitive impedance connected in parallel, and wherein the resistance R3 of the second resistor is related to the resistance R1 of the first resistor such that R3>>R1, and wherein the capacitance C1 of the first capacitive impedance and the capacitance C2 of the second capacitive impedance are related such that C1>>C2.

* * * * *